United States Patent
Hsu et al.

[11] Patent Number: 6,117,691
[45] Date of Patent: Sep. 12, 2000

[54] METHOD OF MAKING A SINGLE TRANSISTOR FERROELECTRIC MEMORY CELL WITH ASYMMETRICAL FERROELECTRIC POLARIZATION

[75] Inventors: Sheng Teng Hsu; Jong Jan Lee, both of Camas, Wash.

[73] Assignees: Sharp Laboratories of America, Inc., Camas, Wash.; SharpKabushiki Kaisha, Osaka, Japan

[21] Appl. No.: 09/287,726

[22] Filed: Apr. 7, 1999

Related U.S. Application Data

[60] Division of application No. 08/905,380, Aug. 4, 1997, Pat. No. 5,962,884, which is a continuation-in-part of application No. 08/812,579, Mar. 7, 1997, Pat. No. 5,731,608.

[51] Int. Cl.$^7$ ...................................................... H01G 7/06
[52] U.S. Cl. .............................................. 438/3; 438/240
[58] Field of Search .............................. 438/3, 240, 250

[56] References Cited

U.S. PATENT DOCUMENTS

| | | | |
|---|---|---|---|
| 5,373,462 | 12/1994 | Achard et al. | 365/145 |
| 5,416,735 | 5/1995 | Onishi et al. | 365/145 |

*Primary Examiner*—Jey Tsai
*Attorney, Agent, or Firm*—David C. Ripma; Matthew D. Rabdau

[57] ABSTRACT

A method of forming a semiconductor structure having a ferroelectric memory (FEM) gate unit on a silicon substrate includes implanting doping impurities of a first type into the substrate to form a conductive channel of a first type, implanting doping impurities of a second type in the conductive channel of the first type to form a conductive channel well of a second type, implanting doping impurities of the first type in the conductive channel well of the second type to form a conductive channel of the first conductivity type for use as a gate junction region, implanting doping impurities of the second type in the conductive channel sub-well of the third type on either side of the gate junction region to form plural conductive channels of the second conductivity type for use as a source junction region and a drain junction region; and depositing an FEM gate unit over the gate junction region.

A ferroelectric memory cell includes a silicon substrate of a first conductive type, a well structure of a second conductive type formed in the substrate, a structure of the first conductive type formed in the second conductivity type well structure, for use as a gate junction region. A source junction region and a drain junction region are located in the sub-well on either side of the gate junction region, doped to form conductive channels of second conductive type. A FEM gate unit overlays the conductive channel of the gate junction region. An insulating layer overlays the junction regions, the FEM gate unit and the substrate. Suitable electrodes are connected to the various active regions in the memory cell.

11 Claims, 3 Drawing Sheets

METHOD OF MAKING A SINGLE TRANSISTOR FERROELECTRIC MEMORY CELL WITH ASYMMETRICAL FERROELECTRIC POLARIZATION

CROSS REFERENCE TO RELATED APPLICATIONS

This application is a divisional of application Ser. No. 08/905,380, filed Aug. 4, 1997, entitled "Single Transistor Ferroelectric Memory Cell With Asymmetrical Ferroelectric Polarization and Method of Making the Same," invented by Sheng Teng Hsu and Jong Jan Lee, now U.S. Pat. No. 5,962,884; which is a continuation-in-part of application Ser. No. 08/812,579, filed Mar. 7, 1997, entitled "One Transistor Ferroelectric Memory Cell and Method of Making the Same," invented by Sheng Teng Hsu and Jong Jan Lee, now U.S. Pat. No. 5,731,608.

BACKGROUND OF THE INVENTION

This application relates to ferroelectric thin films which are used in nonvolatile memories and specifically to a shallow junction metal-ferroelectric-metal-silicon semiconductor. Known ferroelectric random access memories (FRAM) are constructed with one transistor (1T) and one capacitor (1C). The capacitor is generally made by sandwiching a thin ferroelectric film between two conductive electrodes, which electrodes are usually made of platinum. The circuit configuration and the read/write sequence of this type of memory are similar to that of conventional dynamic random access memories (DRAM), except that no data refreshing is necessary in a FRAM. Known FRAMs have a fatigue problem that has been observed in the ferroelectric capacitor, which is one of the major obstacles that limit the viable commercial use of such memories. The fatigue is the result of a decrease in the switchable polarization (stored nonvolatile charge) that occurs with an increased number of switching cycles. As used in this case, "switching cycles" refers to the sum of reading and writing pulses in the memory.

Another known use of ferroelectric thin films in memory applications is to form a ferroelectric-gate-controlled field effect transistor (FET) by depositing the ferroelectric thin film directly onto the gate area of the FET. Such ferroelectric-gate controlled devices have been known for some time and include devices known as metal-ferroelectric-silicon (MFS) FETs. FRAMs incorporating the MFS FET structure have two major advantages over the transistor-capacitor configuration: (1) The MFS FET occupies less surface area, and (2) provides a non-destructive readout (NDR). The latter feature enables a MFS FET device to be read thousands of times without switching the ferroelectric polarization. Fatigue, therefore, is not a significant concern when using MFS FET devices. Various forms of MFS FET structures may be constructed, such as metal ferroelectric insulators silicon (MFIS) FET, metal ferroelectric metal silicon (MFMS) FET, and metal ferroelectric metal oxide silicon (MFMOS) FET.

There are a number of problems that must be overcome in order to fabricate an efficient MFS FET device. The first problem is that it is difficult to form an acceptable crystalline ferroelectric thin film directly on silicon. Such structure is shown in U.S. Pat. No. 3,832,700. Additionally, it is very difficult to have a clean interface between the ferroelectric material and the silicon. Further, there is a problem retaining an adequate charge in the ferroelectric material. A FEM structure on a gate region is shown in U.S. Pat. No. 5,303, 182, which emphasizes that the transfer of metal ions into the gate region is undesirable. Similar structure is shown in U.S. Pat. No. 5,416,735.

It is an object of this invention to overcome the aforementioned problems.

Another object of the invention is to provide an MFS FET device which provides a non-destructive readout.

Yet another object of the invention to provide an MFS FET device that occupies a relatively small surface area.

A further object of the invention is to provide an MFS FET device which requires a relatively low programming voltage.

Yet another object of the invention is to provide an FEM gate unit which has an asymmetric ferroelectric polarization.

The method of the invention includes forming a semiconductor structure having a ferroelectric memory (FEM) gate unit on a silicon substrate, with doping impurities of a first type to form a conductive substrate of a first type, implanting doping impurities of a second type in the conductive substrate of the first type to form a conductive channel of a second type, implanting doping impurities of a third type in the conductive channel of the second type to form a conductive channel of a third type for use as a gate junction region, implanting doping impurities of a fourth type on either side of the gate junction region to form plural conductive channels of a fourth type for use as a source junction region and a drain junction region; and depositing an FEM gate unit over the gate junction region.

The ferroelectric memory cell of the invention includes a silicon substrate of a first conductive type, a well structure of a second conductive type formed in the substrate, a sub-well structure of a third conductive type formed in the well structure, for use as a gate junction region. A source junction region and a drain junction region are located in the sub-well on either side of the gate junction region, along with a program line region, all doped to form conductive channels of a fourth type. A FEM gate unit overlays the conductive channel of the third type. An insulating layer overlays the junction regions, the FEM gate unit and the substrate. Suitable electrodes are connected to the various active regions in the memory cell.

These and other objects and advantages of the invention will become more fully apparent as the description which follows is read in conjunction with the drawings.

DETAILED DESCRIPTION OF THE PREFERRED EMBODIMENTS

The ferroelectric memory (FEM) cell of the invention may be formed on a SOI (SIMOX) substrate, or, it may be formed in a bulk silicon substrate. The description herein will concentrate on the formation of the FEM gate unit on a bulk silicon substrate.

Figure 1:
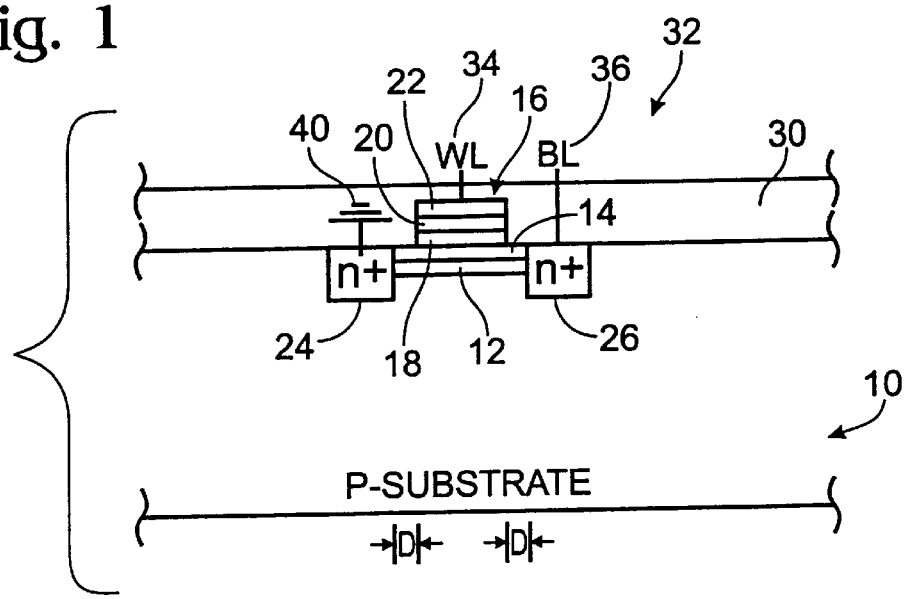
FIG. 1 depicts a FEM cell constructed according to the invention.

Turning now to FIG. 1, a silicon substrate is depicted at 10. Substrate 10, in the preferred embodiment is a single-crystal substrate, and is formed of bulk silicon. Other embodiments may be formed on a SOI substrate. As used herein, "silicon substrate" refers to either a bulk silicon substrate or a SOI substrate, or to any other suitable silicon-based substrate. As depicted in FIG. 1, the p⁻ substrate 10 has doping impurities of a first type, which is a boron or boron compound, of a concentration of about $1.0 \cdot 10^{15}$ cm⁻³ to $5.0 \cdot 10^{15}$ cm⁻³.

A shallow n⁻ type layer 12, also referred to herein as conductive channel of a second type, which has doping impurities of a second conductivity type, is then formed under the gate area by phosphorous or arsenic implantation. The ion energy is in the range of 10 keV to 50 keV and the dose is in the range of $1.0 \cdot 10^{12}$ cm⁻² to $1.0 \cdot 10^{13}$ cm⁻².

A very shallow layer of p⁻ type silicon 14 is formed, and has doping impurities of a third type, which are the same as the doping impurities of the first type, implanted with $BF_2$ to the top of the n⁻ type second conducting layer. The $BF_2$ energy is in the range of 10 keV to 40 keV, and the dose range is between about $5.0 \cdot 10^{11}$ cm⁻² to $5.0 \cdot 10^{12}$ cm⁻². This layer is referred to herein as a conductive channel of a first conductivity type in the conductive channel of the second conductivity type for use as a gate junction region.

At this point, formation of the FEM gate unit may begin. A FEM gate unit is identified generally at 16. and includes a lower metal layer, or electrode, 18, the ferroelectric (FE) material 20 and a upper metal layer, or electrode, 22. The construction of FEM gate unit 16. begins with the deposition of the lower electrode 18 on p⁻ layer 14. Lower electrode 18. may be formed of Ir or Ir/IrO₂ alloy, or an alloy of Pt/Ir, or other suitable conductive material. The thickness of this metal is 20 nm to 100 nm, in the preferred embodiment.

Next, the FE material is deposited by chemical vapor deposition (CVD), after appropriate masking. The FE material may be any of the following: Pb(Zr, Ti)O₃ (PZT), SrBi₂Ta₂O₉ (SBT), Pb₅Ge₃O₁₁, BaTiO₃, or LiNbO₃. The preferred compounds are, in order of preference, SBT, Pb₅Ge₃O₁₁ and PZT. Most of the experimental work in the FEM gate unit field has been done on PZT compounds. The FE material 20. is deposited to a thickness of 50 nm to 400 nm.

The upper electrode 22 is then formed over the FE material. The upper electrode may be formed of Pt, Pt/Ir alloy, Pt/IrO₂ alloy, or other suitable materials, to a thickness of 20 nm to 200 m.

Photoresist is applied over the FEM gate unit, and the cell is then etched to the proper configuration and size. It should be appreciated that the three layers of the FEM gate unit need not be precisely aligned as shown, as their shape may be formed by applying a photoresist, and etching, with masks that have different geometries. However, for the sake of clarity, the FEM gate unit is depicted as a structure which has contiguous, aligned sidewalls.

The p⁻ substrate 10 is now modified by implanting the appropriate ions, also referred to herein as doping impurities of a fourth type which are the same as the doping impurities of the second type, to form two n⁺ layers, also referred to herein as conductive channels of the second conductivity type, which will serve as source region 24 and a drain region 26. Appropriate ion implantation in this instance may be the implantation of As ions at a preferred energy of about 50 keV, although implantation in a range of 40 keV to 70 keV is acceptable, and a dosing in a range of $1 \cdot 10^{15}$ cm⁻² to $5 \cdot 10^{15}$ cm⁻². Alternately, phosphorus ions may be implanted in an energy range of 30 keV–60 keV in the same dosing range.

The wafer is heat treated to activate and diffuse the implanted ions, both in the source region and drain region. Temperature range for the heat treatment is in the range of 500° C. to 1100° C., to allow activation and diffusion of the implanted ions.

A layer of $TiO_x$, $Si_3N_4$, or other suitable barrier insulation material, 30, is formed by CVD to protect the FEM gate unit, which results in the formation of a FE memory cell 32.

To complete the description of FEM cell 32, bores are formed in insulating layer 30 to receive a word line (WL) (gate) electrode 34, and a bit line (BL) electrode 36, which are connected to their respective components. Source 24 is connected to ground 40.

The embodiment depicted in FIG. 1 represents a ferroelectric gate depletion-type MFMS transistor. At zero gate voltage, the charge in the n⁻ channel underlying the FEM gate unit is completely depleted. Accordingly, the leakage current is very small. In order to maintain the small leakage, the distance between any edge of lower electrode 18 and the edges of n⁺ source region 24 and n⁺ drain region 26, represented by "D", has to be at least 50 nm in order that the leakage current remain small. However, as D increases, the series resistance of the memory cell also increases. It is therefore preferred that D be no larger than 300 nm. The potential barrier between the p⁻ conductive layer of the second conductivity type 14 and the n⁻ conductive layer of the second type 12 is on the order of 0.9 eV. A potential barrier of this magnitude causes the n⁻ type silicon channel to be completely depleted when the ferroelectric material is not polarized. When the ferroelectric material 20 is polarized with positive charge adjacent to lower electrode 18, the threshold voltage is small. When the ferroelectric material 20 is polarized with a negative charge adjacent to the lower electrode 18, the threshold voltage of the memory transistor is very large. The nature of these memory charges and techniques for changing the amount of voltage necessary to the program the cells will be described later herein.

Alternately, the source/drain ion implantation and annealing may be completed before the deposition of the lower gate electrode, if the ferroelectric material is unable to sustain high temperature heat treatment.

Operation

The structure constructed according to the invention is particularly efficient because the FEM gate unit, located over the conductive channel on the gate region, is able to shift the polarity of the gate region, allowing efficient current flow from the source through the channel to the drain. The structure provides a total charge depletion when in an "off" condition. The operating theory of a depletion-type device is similar to that of a junction FET.

Figure 2A:
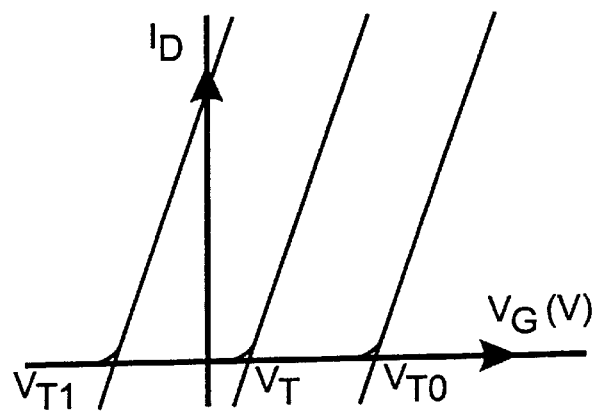
FIGS. 2a–2b is a graph of $I_D$ vs. $V_G$ for the FEM gate unit of the invention.

The general $I_D$ vs. $D_G$ plot for the MFMS FET is depicted in FIG. 2. FIG. 2a depicts the $I_D$ vs. $D_G$ characteristics of a symmetric FEM cell. The centerline is the $I_D$ vs. $V_0$ curve when the FEM gate unit is not charged, where $P_r=0$. When the FEM cell is programmed to a "1" state, the threshold voltage of the FEM cell is negative. Thus, a large drain current may flow through the channel region even if $V_G=0V$. Such a device is not suitable for large scale array applications.

Figure 2B:
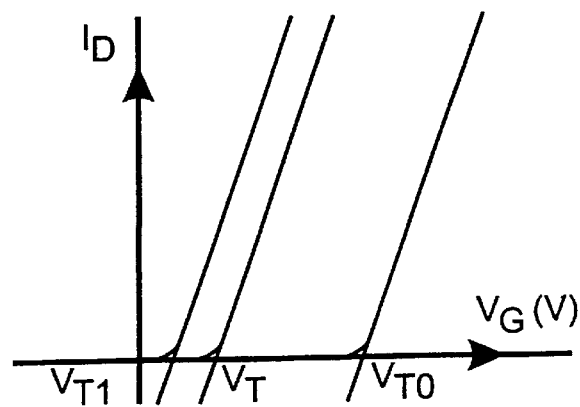

FIG. 2b depicts the $I_D$ vs. $D_G$ characteristics of an asymmetric FEM cell of the invention. The threshold voltage of the FEM cell when it is programmed to a "1" state is positive. No current may flow through the device when the gate is at ground potential. A large scale memory array of such devices will have a very small standby leakage current.

The asymmetric polarized ferroelectric memory transistor cell of the invention may be applied to an MFMS cell and an MFMOS cell to provide a low leakage, high speed, very large scale memory array. The low leakage current is achieved by having a positive threshold voltage both for the "1" and "0" states. High speed write and read is achieved by increasing the drive current and decreasing the channel capacitance of the device. Because the electron mobility is much higher than the hole mobility, an n⁻ channel memory devise is preferred for high speed operation.

Figure 3A:
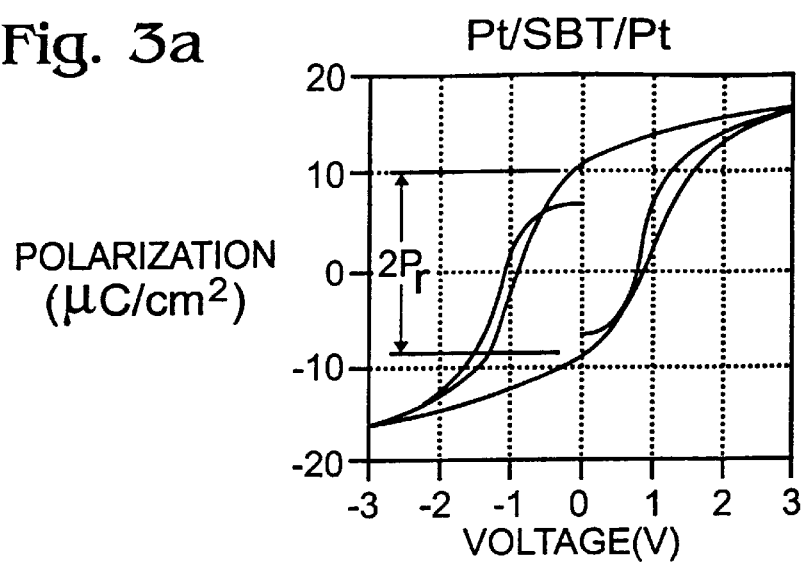
FIGS. 3a–3c depicts the P-E hysteresis loops for a variety of FEM gate units.
Figure 3B:
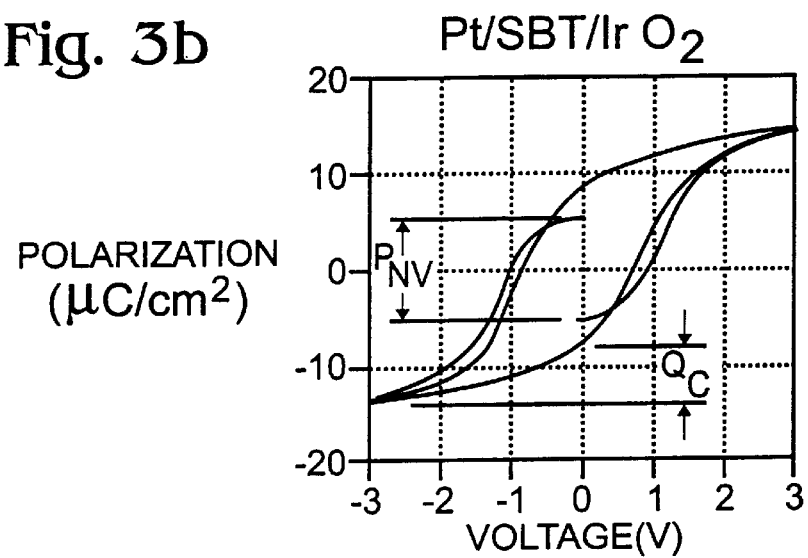
Figure 3C:
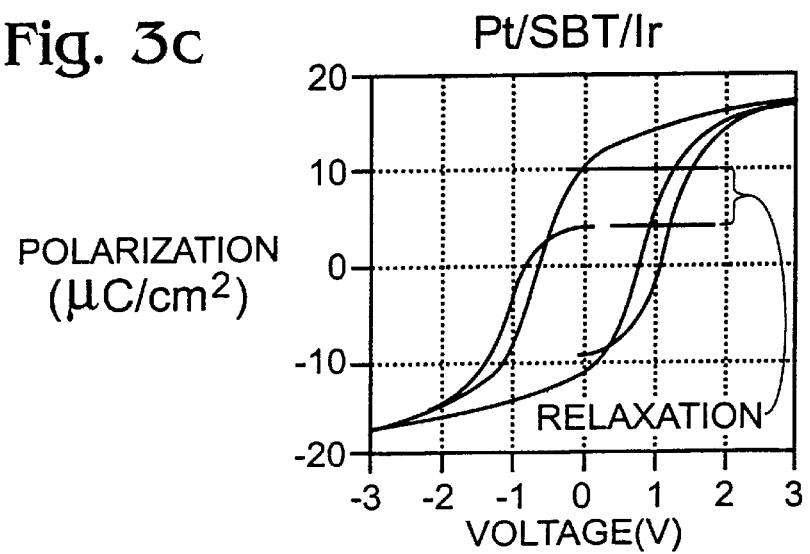

Referring now to FIG. 3, Jiang et al., "A New Technology for High-Density Nonvolatile Ferroelectric SrBi$_2$Ta$_2$O$_9$ Memories", 1996 VLSI Technology Symposium, Honolulu, Jun., 11–13, 1996, page 26, described that replacing platinum with iridium as the lower electrode of a ferroelectric memory capacitor resulted in an improved performance. As depicted in FIG. 3, the P-E hysteresis loops measured for 100 kHz single-shot pulses for SrBi$_2$Ta$_2$O$_9$ (SBT) capacitor having different bottom electrodes is depicted. In FIG. 3a, the bottom electrode is Pt/TiO$_2$; in FIG. 3b, the lower electrode is IrO$_2$; and in FIG. 3c, the bottom electrode is pure Ir. The remanent polarization, P$_{NV}$, is measured ten seconds after the capacitor has been written to. As shown in FIG. 3c, a Pt/SBT/Ir capacitor displays a very large depolarization charge at positive polarizations, while the depolarization of the negatively polarized capacitor is very small.

Figure 4A:
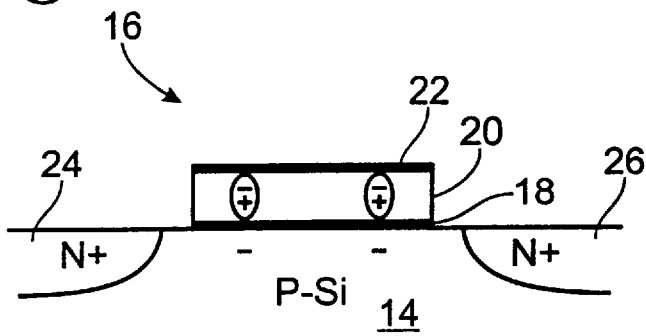
FIGS. 4a–4b depicts the basic operation principle for the MES FET devices of the invention.
Figure 4B:
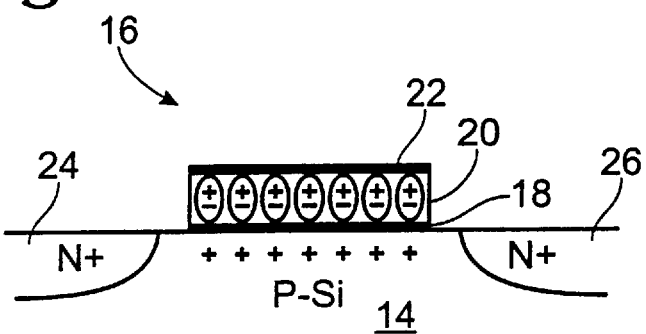

In order to have a positive "1" state (the high conductive state) threshold voltage, the device needs to have a small positive polarization charge located at the bottom ferroelectric/electrode interface, as shown in FIG. 4a. In order to maintain a large memory window, a large negative polarization charge at the bottom ferroelectric/electrode interface is also required, as shown in FIG. 4b. This can be achieved with a Pt/SBT/Ir semiconductor structure. The steady state "1" state polarization charge is about 10 $\mu$C/cm$^2$, while the steady state "0" state polarization charge is about minus 2 $\mu$C/cm$^2$. Corresponding threshold voltage shiftings are 12.1 V and −2.42 V, respectively, for a 0.3 $\mu$m SBT thin film with a dielectric constant of 280. By adjusting the channel doping density to achieve the threshold voltage of about 3 V at 0 ferroelectric polarization, the V$_{T1}$ and V$_{T0}$ of about 0.6 volt and 15 volt may be obtained, as depicted in FIG. 2b.

Figure 5:
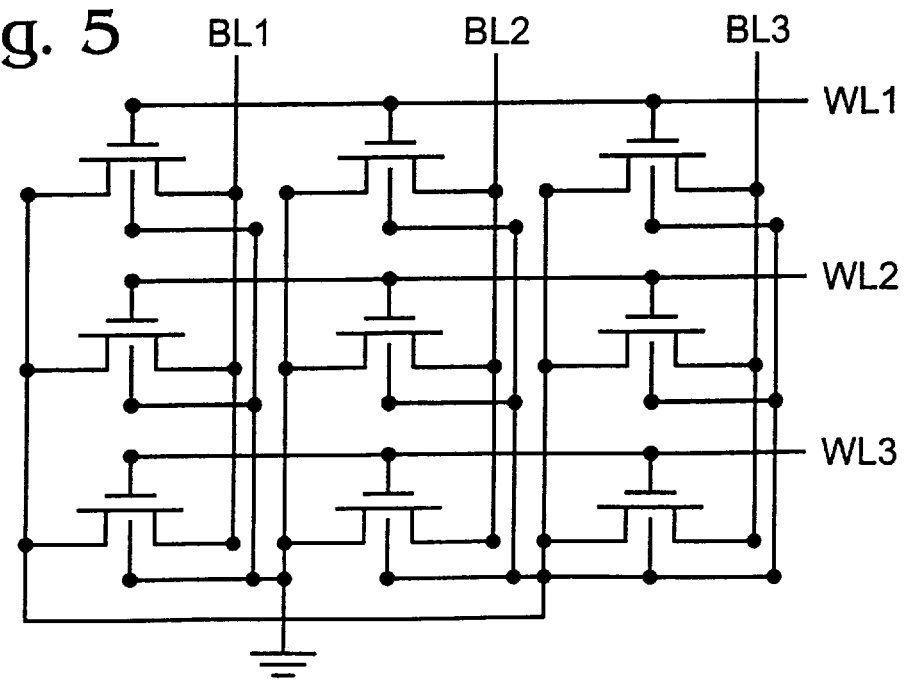
FIG. 5 depicts a memory array constructed according to the invention.

This ferroelectric memory device may be used in low voltage, high density and high speed applications. The memory cell is laid out in the p⁻ well 10, as depicted in FIG. 5. FIG. 5 depicts a nine-cell memory array, wherein the word lines are designated WL1, WL2 and WL3, the bit, or drain, lines are designated BL1, BL2 and BL3. The source regions and the substrate of all of the transistors are grounded. The source, word line, and bit line are connected independently to peripheral circuits, as shown in FIG. 5. The memory array is block programmed to the "1" (high conductive) state by applying a positive voltage of V$_{PP}$ to the word line (gate) with the bit line connected to ground. In order to program each individual memory cell to a "0" (low conductive) state, a negative programming voltage, −V$_{PP}$, is applied to the word line while a positive programming voltage of V$_{PP}$ is applied to the bit line. This results in only one cell having a bias voltage of −V$_{PP}$ at the gate and +V$_{PP}$ at the drain. This memory cell is the only cell in the entire array which will be written to the "0" state.

The asymmetric polarization relaxation may be observed in many combinations of electrodes. Additionally, it may be observed on any ferroelectric thin films and any kind of ferroelectric gate structures. The mechanism of the asymmetric polarization relaxation is both complex and sensitive to processed condition. This requires that, in the preferred embodiment of the invention, the asymmetric polarization relaxation technique should be used to fabricate the ferroelectric gate controlled one transistor memory cell.

The threshold voltage for FEM gate unit 16. may be determined as follows: for a large scale array the threshold voltage at the "1" state has to be a small positive value, i.e., 0.4 V to 0.8 V. The threshold voltage for the "0" state has to be larger than the supply voltage, i.e., 3.3 V. The n⁻ channel layer is depleted by the p⁻ type substrate junction as well as by the very shallow p⁻ surface layer and the gate bias voltage. It can be shown that the memory window is equal to:

$$\Delta V_T = \frac{2Q_{FE}}{C_{FE}} \quad (1)$$

where Q$_{FE}$ is the remanent charge and C$_{FE}$ is the ferroelectric capacitance of the gate unit.

During a read operation, a voltage, V$_a$, of no larger than the coercive voltage, i.e., that voltage where the memory content may change, is applied to the gate electrode and the drain electrode. Because the content of the memory cell is not disturbed when any electrode is biased with V$_a$, the read operation will not disturb the memory contents of any memory cell. Therefore, a long charge retention is obtained.

We claim:

1. A method of forming a semiconductor structure having a ferroelectric memory (FEM) gate unit on a silicon substrate, comprising:

incorporating doping impurities of a first type into the substrate to form a conductive substrate of a first conductivity type;

implanting doping impurities of a second type in the conductive substrate of the first type to form a conductive channel of a second conductivity type;

implanting doping impurities of said first type in the conductive channel of the second conductivity type to form a conductive channel of said first conductivity type for use as a gate junction region;

implanting doping impurities of said second type on either side of the gate junction region to form plural conductive channels of said second conductivity type for use as a source junction region and a drain junction region; and depositing an FEM gate unit over the gate junction region, including depositing a lower metal layer, a FE layer and an upper metal layer, wherein the FEM gate unit is sized on the gate junction region such that any edge of the FEM gate unit is a distance "D" from the edges of the source junction region and the drain junction region, where "D" is between about 50 nm and 300 nm.

2. The method of claim 1 wherein said step of implanting doping impurities of a second type includes implanting a dopant taken from the group consisting of phosphorous and arsenic at an energy level in the range of about 10 keV to 50 keV and at a doses in a range of about 5.0 10$^{12}$ cm$^{-2}$ to 5.0 10$^{13}$ cm$^{-2}$.

3. The method of claim 1 wherein said step of implanting doping impurities of said first type in the conductive channel of the second type includes implanting a dopant taken from the group consisting of B or BF$_2$ at an energy in a range of 1 keV to 10 keV or 10 keV to 50 keV, respectively, and a dose of 5 10$^{11}$ cm$^{-2}$ to 1 10$^{13}$ cm$^{-2}$.

4. The method of claim 1 which includes annealing the structure at a temperature of about 500° C. to 1100° C. to diffuse B or BF$_2$ ions from the gate junction region to form a barrier layer between the gate and the FEM gate unit.

5. The method of claim 1 wherein said step of depositing the FEM gate unit includes depositing a lower metal layer of material taken from the group consisting of Ir, Ir/IrO$_2$ alloy, having a thickness of about 20 nm to 100 nm, depositing a FE layer of material taken from the group consisting of Pb(Zr, Ti)O$_3$ (PZT), SrBi$_2$Ta$_2$O$_9$ (SBT), Pb$_5$Ge$_3$O$_{11}$, BaTiO$_3$ and LiNbO$_3$, having a thickness of about 50 nm to 400 nm, and depositing an upper metal layer of material taken from the group consisting of Pt, Ir, IrO$_2$ and Pt/Ir alloy, having a thickness of 20 nm to 100 nm.

6. The method of claim 1 wherein said step of implanting doping impurities of said second type on either side of the gate junction region includes doping the device area with ions taken from the group consisting of As, implanted at an energy of about 40 keV to 70 keV, and phosphorous, implanted at an energy of about 30 keV to 60 keV, the ions having a dose of about 1 10$^{15}$ cm$^{-2}$ to 5 10$^{15}$ cm$^{-2}$.

7. The method of claim 1 wherein said step of depositing an insulating structure about the FEM gate unit includes depositing a layer of insulating material taken from the group consisting of TiO$_x$ and Si$_3$N$_4$.

8. A method of forming a semiconductor structure having a ferroelectric memory (FEM) gate unit on a silicon substrate, comprising:

implanting doping impurities of a first type into the substrate to form a conductive substrate of a first conductivity type;

implanting doping impurities of a second type in the conductive substrate of the first type to form a conductive channel of a second conductivity type;

implanting doping impurities of said first type in the conductive channel of the second conductivity type to form a conductive channel of said first conductivity type for use as a gate junction region;

implanting doping impurities of said second type on either side of the gate junction region to form plural conductive channels of said second conductivity type for use as a source junction region and a drain junction region; and depositing an FEM gate unit over the gate junction region, including depositing a lower metal layer of material taken from the group consisting of Ir and Ir/IrO$_2$ alloy, having a thickness of about 20 nm to 100 nm, a FE layer of material taken from the group consisting of Pb(Zr, Ti)O$_3$ (PZT), SrBi$_2$Ta$_2$O$_9$ (SBT), Pb$_5$Ge$_3$O$_{11}$, BaTiO$_3$ and LiNbO$_3$, having a thickness of about 50 nm to 400 nm, and an upper metal layer of material taken from the group consisting of Pt, Ir IrO$_2$ and Pt/Ir alloy, having a thickness of 20 nm to 100 nm, wherein the FEM gate unit is sized on the gate junction region such that any edge of the FEM gate unit is a distance "D" from the edges of the source junction region and the drain junction region, where "D" is between about 50 nm and 300 nm.

9. The method of claim 8 which includes annealing the structure at a temperature of about 500° C. to 1100° C. to diffuse B or BF$_2$ ions from the gate junction region to form a barrier layer between the gate channel and the FEM gate unit.

10. The method of claim 8 wherein said step of implanting doping impurities of the second type includes doping the device area with ions taken from the group consisting of As, implanted at an energy of about 40 keV to 70 keV, and phosphorous, implanted at an energy of about 30 keV to 60 keV, the ions having a dose of about 1 10$^{15}$ cm$^{-2}$ to 5 10$^{15}$ cm$^{-2}$.

11. The method of claim 8 wherein said depositing an insulating structure about the FEM gate unit includes depositing a layer insulating material taken from the group consisting of TiO$_x$ and Si$_3$N$_4$.

* * * * *